US008610123B2

(12) United States Patent
Park et al.

(10) Patent No.: US 8,610,123 B2
(45) Date of Patent: Dec. 17, 2013

(54) ORGANIC LIGHT EMITTING DIODE DISPLAY AND MANUFACTURING METHOD THEREOF

(75) Inventors: Jong-Hyun Park, Yongin (KR); Chun-Gi You, Yongin (KR); Sun Park, Yongin (KR); Ki-Nyeng Kang, Yongin (KR); Yul-Kyu Lee, Yongin (KR); Dae-Woo Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 183 days.

(21) Appl. No.: 13/064,864

(22) Filed: Apr. 21, 2011

(65) Prior Publication Data
US 2012/0074420 A1 Mar. 29, 2012

(30) Foreign Application Priority Data
Sep. 27, 2010 (KR) .................. 10-2010-0093353

(51) Int. Cl.
*H01L 29/08* (2006.01)
*H01L 35/24* (2006.01)

(52) U.S. Cl.
USPC .......... 257/59; 257/40; 257/72; 257/E51.018; 438/34

(58) Field of Classification Search
USPC .................. 257/40, 59, 72, E51.018; 438/34; 349/46, 47, 69
See application file for complete search history.

(56) References Cited

U.S. PATENT DOCUMENTS

| 8,415,659 B2* | 4/2013 | Kim et al. ............... 257/40 |
| 2006/0147650 A1* | 7/2006 | Park ................... 428/1.1 |
| 2009/0267074 A1* | 10/2009 | Kwon et al. ............ 257/72 |

FOREIGN PATENT DOCUMENTS

| KR | 10-2005-0100950 A | 10/2005 |
| KR | 10-0685803 B1 | 2/2007 |
| KR | 10-2007-0106260 A | 11/2007 |
| KR | 10-2009-0021443 A | 3/2009 |

* cited by examiner

*Primary Examiner* — Kenneth Parker
*Assistant Examiner* — Jose R Diaz

(57) ABSTRACT

An organic light emitting diode (OLED) display includes: a substrate; a semiconductor layer on the substrate; a gate insulating layer covering the semiconductor layer; a gate electrode formed in the gate insulating layer and overlapping the semiconductor layer; a pixel electrode formed in a pixel area over the gate insulating layer; an interlayer insulating layer covering the gate electrode and the gate insulating layer, and exposing the pixel electrode through a pixel opening; a source electrode and a drain electrode formed in the interlayer insulating layer and connected to the semiconductor layer; and a barrier rib covering the interlayer insulating layer, the source electrode, and the drain electrode, and the drain electrode contacts a side wall of the pixel opening and is connected to the pixel electrode. Such an OLED display may have an improved aperture ratio.

15 Claims, 10 Drawing Sheets

ORGANIC LIGHT EMITTING DIODE DISPLAY AND MANUFACTURING METHOD THEREOF

BACKGROUND

1. Field

Embodiments relate to an organic light emitting diode (OLED) display and a manufacturing method thereof.

2. Description of the Related Art

An organic light emitting diode (OLED) display includes two electrodes and an organic emission layer disposed between the two electrodes. Electrons injected from one electrode and holes injected from the other electrode are combined in the organic emission layer, to form excitons. Thus, light is emitted by energy generated from the excitons.

The organic light emitting diode (OLED) display is classified as top emission, bottom emission, and double-sided emission depending on the light emission direction from an organic emission layer. According to light emission types, different materials of pixel electrodes or common electrodes of the organic light emitting diode (OLED) display are required.

The above information in the Background is only for enhancing the understanding of the described technology. Therefore, it may contain information that does not form the prior art already known in this country to a person of ordinary skill in the art.

SUMMARY

It is a feature of an embodiment to provide a bottom emission type of organic light emitting diode (OLED) display for improving an aperture ratio.

It is another feature of an embodiment to provide a manufacturing method of a bottom emission type of organic light emitting diode (OLED) display for improving an aperture ratio and reducing a manufacturing process.

At least one of the above and other features and advantages may be realized by providing a organic light emitting diode display including: a substrate; a semiconductor layer on the substrate; a gate insulating layer covering the semiconductor layer; a gate electrode formed in the gate insulating layer and overlapping the semiconductor layer; a pixel electrode formed in a pixel area over the gate insulating layer; an interlayer insulating layer covering the gate electrode and the gate insulating layer, and exposing the pixel electrode through a pixel opening; a source electrode and a drain electrode formed in the interlayer insulating layer and connected to the semiconductor layer; and a barrier rib covering the interlayer insulating layer, the source electrode, and the drain electrode, and the drain electrode contacts a side wall of the pixel opening and is connected to the pixel electrode.

The drain electrode is extended to the side wall of the pixel opening.

A gate auxiliary member between the drain electrode and the pixel electrode.

A gate auxiliary member following an outer part of the pixel electrode.

A gate auxiliary member with the same material as the gate electrode.

At least one of the above and other features and advantages may also be realized by providing a method for manufacturing an organic light emitting diode display, including: forming a semiconductor layer on a substrate; forming a gate insulating layer covering the semiconductor layer; forming a pixel electrode and a gate electrode on the gate insulating layer; forming an interlayer insulating layer on the gate electrode and gate insulating layer, the interlayer insulating layer having a pixel opening for exposing the pixel electrode; and forming a source electrode and a drain electrode connected to the semiconductor layer through a plurality of contact holes on the interlayer insulating layer, and the drain electrode contacts a side wall of the pixel opening and is connected to the pixel electrode.

The drain electrode is extended to the side wall of the pixel opening.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
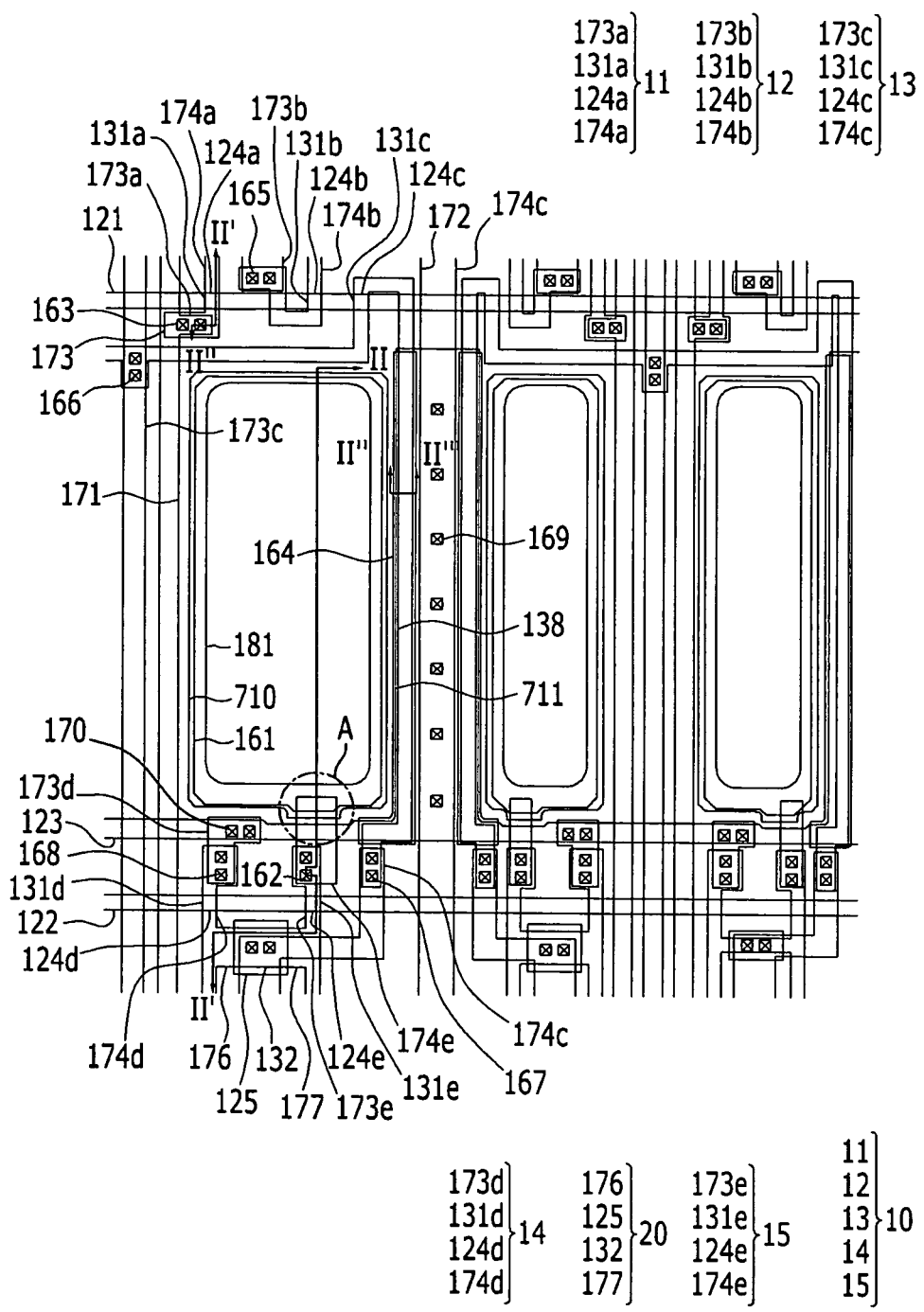
FIG. 1 illustrates a layout view of an organic light emitting diode (OLED) display according to an exemplary embodiment.

Korean Patent Application No. 10-2010-0093353, filed on Sep. 27, 2010, in the Korean Intellectual Property Office, and entitled: "Organic light Emitting Diode Display and Manufacturing Method Thereof," is incorporate by reference herein in its entirety.

Example embodiments will not be described more fully hereinafter with reference to the accompanying drawings; however, they may be embodied in different forms and should not be construed as limited to the embodiments set forth herein. Rather, these embodiments are provided so that this disclosure will be through and complete, and will fully convey the scope of the inventive concept to those skilled in the art.

The drawings and description are to be regarded as illustrative in nature and not restrictive. Like reference numerals designate like elements throughout the specification. The size and thickness of each component shown in the drawings are arbitrarily shown for understanding and ease of description, but the inventive concept is not limited thereto.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

An organic light emitting diode (OLED) display according to an exemplary embodiment will now be described with reference to FIGS. 1-2.

FIG. 1 illustrates a layout view of an organic light emitting diode (OLED) display according to an exemplary embodiment. FIG. 2 illustrates a cross-sectional view of an organic light emitting diode (OLED) display of FIG. 1 with respect to lines II-II', II'-II", and II"-II'".

Figure 2:
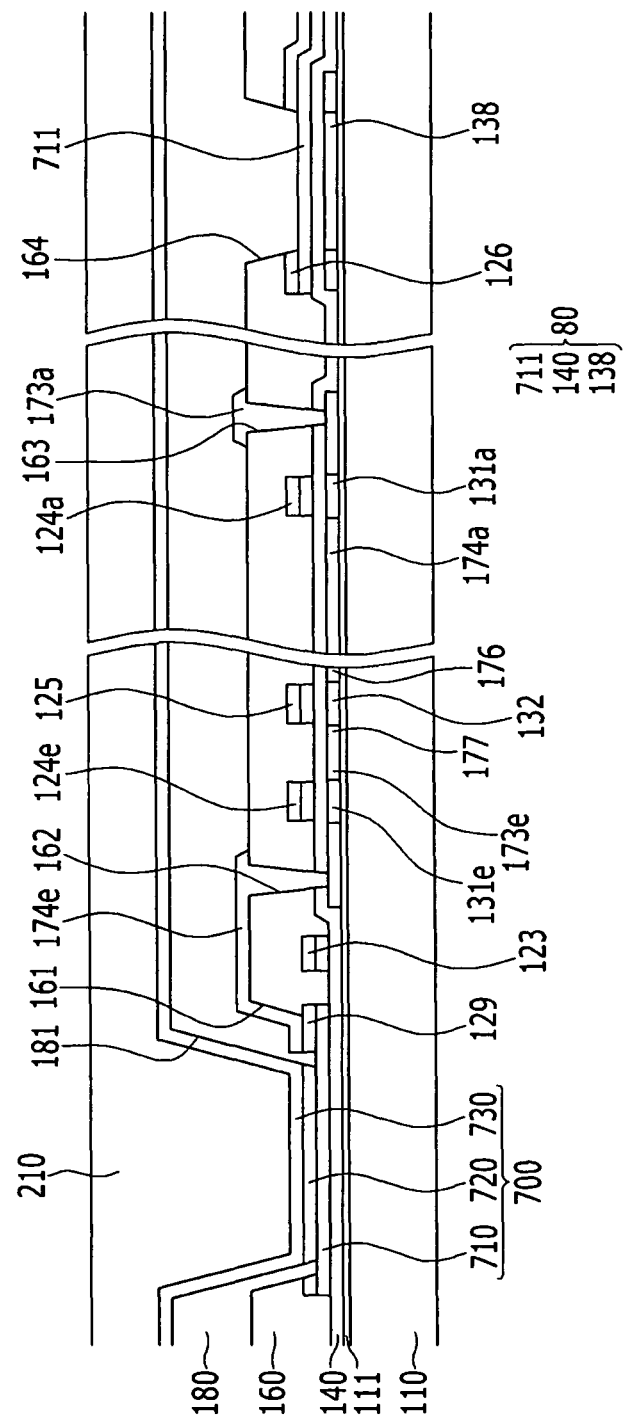
FIG. 2 illustrates a cross-sectional view of an organic light emitting diode (OLED) display of FIG. 1 with respect to lines II-II', II'-II'', and II''-II'''.

As illustrated in FIGS. 1-2, the organic light emitting diode (OLED) display includes a plurality of switching thin film transistors 10 formed on respective pixels, a drive thin film transistor 20, a capacitor 80, and an organic light emitting element 700. The organic light emitting diode (OLED) display further includes a gate line 121 disposed in a direction, a gate control line 122, a data line 171 crossing the gate line 121 and the gate control line 122 in an insulating manner, and a common voltage line 172. One pixel may be defined by a border line of the gate line 121, the data line 171, and the common voltage line 172. However, the pixel is not limited thereto.

The organic light emitting element 700 includes a pixel electrode 710, an organic emission layer 720 formed on the pixel electrode 710, and a common electrode 730 formed on the organic emission layer 720. The pixel electrode 710 may be an anode (+), that is a hole injection electrode, and the common electrode 730 may be a cathode (−), that is an electron injection electrode. However, an exemplary embodiment is not limited thereto. According to the driving method of the organic light emitting diode (OLED) display, the pixel electrode 710 may be a cathode and the common electrode 730 may be an anode. Holes and electrons are injected into the organic emission layer 720 from the pixel electrode 710 and the common electrode 730. Light is emitted when the excitons are changed from the exited state to the ground state. The excitons are the combination of the injected holes and electrons.

The capacitor 80 includes a first storage plate 138 and a second storage plate 711 with a gate insulating layer 140 disposed therebetween. The interlayer insulating layer 140 is a dielectric material. Capacitance is determined by the charges stored in the capacitor 80 and the voltage between both storage plates 138 and 711.

A plurality of switching thin film transistors 10 include first to fifth switching thin film transistors (11, 12, 13, 14, 15).

The first switching thin film transistor 11 includes a first switching semiconductor layer 131a, a first switching gate electrode 124a, a first switching source electrode 173a, and a first switching drain electrode 174a. The first switching drain electrode 174a corresponds to a switching drain region of the first switching semiconductor layer.

The second switching thin film transistor 12 includes a second switching semiconductor layer 131b, a second switching gate electrode 124b, a second switching source electrode 173b, and a second switching drain electrode 174b. The second switching drain electrode 174b corresponds to a switching drain region of the second switching semiconductor layer.

The third switching thin film transistor 13 includes a third switching semiconductor layer 131c, a third switching gate electrode 124c, a third switching source electrode 173c, and a third switching drain electrode 174c.

The fourth switching thin film transistor 14 includes a fourth switching semiconductor layer 131d, a fourth switching gate electrode 124d, a fourth switching source electrode 173d, and a fourth switching drain electrode 174d. The fourth switching drain electrode 174d corresponds to a switching drain region of the fourth switching semiconductor layer.

The fifth switching thin film transistor 15 includes a fifth switching semiconductor layer 131e, a fifth switching gate electrode 124e, a fifth switching source electrode 173e, and a fifth switching drain electrode 174e.

The drive thin film transistor 20 includes a drive semiconductor layer 132, a drive gate electrode 125, a drive source electrode 176, and a drive drain electrode 177. The drive semiconductor layer 132 connects the fourth switching semiconductor layer 131d and the fifth switching semiconductor layer 131e. The drive source electrode 176 corresponds to a drive source region of the drive semiconductor layer 132. The drive drain electrode 177 corresponds to a drive drain region of the drive semiconductor layer 132. Therefore, the drive source electrode 176 is connected to the fourth switching drain electrode 174d. The drive drain electrode 177 is connected to the fifth switching drain electrode 174e.

The first storage plate 138 is connected to the drive gate electrode 125. The second storage plate 711 is connected to the common voltage line 172.

The first switching thin film transistor 11 is used as a switch to select a pixel. The pixel selected may emit light. The first switching gate electrode 124a is connected to the gate line 121. The first switching source electrode 173a is connected to the data line 171. The first switching drain electrode 173a is connected to the drive thin film transistor 20 and the fourth switching thin film transistor 14.

The drive thin film transistor 20 receives a driving voltage from the driving voltage line 172 and the fourth thin film transistor 14. The drive thin film transistor applies the driving voltage to the pixel electrode 710. The driving voltage emits the organic emission layer 720 of the organic light emitting element 700 in the selected pixel. The fifth switching thin film transistor 15 is disposed between the drive drain electrode 177 and the pixel electrode 710 of the drive thin film transistor 20. Thus, deterioration of the organic light emitting element 700 may be compensated.

The fifth switching drain electrode 174e of the fifth switching thin film transistor 15 is extended to the pixel opening 161 of the interlayer insulating layer 160. The fifth switching drain electrode 174e is directly connected to the pixel electrode 710 of the organic light emitting element 700.

Non-uniformity of the threshold voltage of the drive thin film transistor and deterioration of the organic light emitting element can be compensated by forming a plurality of switching thin film transistors on one pixel of the organic light emitting diode (OLED) display.

A configuration of an organic light emitting diode (OLED) display according to an exemplary embodiment will now be described with reference to FIG. 2.

A configuration of a thin film transistor will be described with reference to the first switching thin film transistor 1, the fifth switching thin film transistor 15, and the drive thin film transistor 20. The configurations of the second to fourth switching thin film transistors 12, 13, and 14 are similar to that of the fifth switching thin film transistor 15.

A buffer layer 111 is formed on the substrate 110. A first switching semiconductor layer 131a, a fifth switching semiconductor layer 131e, and a drive semiconductor layer 132 are formed on the buffer layer 111. The substrate 110 may be formed with an insulating substrate, e.g., glass, quartz, ceramic, or plastic. The first switching semiconductor layer 131a, the fifth switching semiconductor layer 131e, and the drive semiconductor layer 132 are formed with polysilicon layers. The first switching semiconductor layer 131a, the fifth switching semiconductor layer 131e, and the drive semiconductor layer 132 includes a channel region with no doped impurity. The first switching semiconductor layer 131a, the fifth switching semiconductor layer 131e, and the drive semiconductor layer 132 includes a source region and a drain region p+ doped and formed on both sides of the channel region. The impurity depends on the type of the thin film transistor.

A gate insulating layer 140 of SiNx or SiO2 is formed on the drive semiconductor layer 132.

A gate line 121, a control gate line 122, and a gate wire are formed on the gate insulating layer 140. The gate line 121 includes a first switching gate electrode 124a. The control gate line 122 includes a fifth switching gate electrode 124e. A gate wire includes a drive gate electrode 125. The gate wire also includes a gate driving voltage line 123 and a second storage plate 711. The second storage plate 711 is vertically connected to the gate driving voltage line 123. The second storage plate 711 is connected to a driving voltage line 172 through a contact hole 169. A pixel electrode 710 is formed on the gate insulating layer 140.

The gate wire includes a lower gate wire and an upper gate wire. The lower gate wire may be made of indium tin oxide (ITO) or indium zinc oxide (IZO). The lower gate wire material is the same material as the pixel electrode 710. The upper gate wire may be formed with multiple layers. The multiple layers may include a metal layer including one of copper (Cu), a copper alloy, aluminum (Al), and an aluminum alloy. The multiple layers may also include a metal including one of molybdenum (Mo) and a molybdenum alloy. For example, the upper gate wire may be formed with three layers of Mo/Al/Mo or Mo/Cu/Mo.

A gate auxiliary line 129 is formed at a position that corresponds to an outer part of the pixel electrode 710. The gate auxiliary line 129 is made of the same material as the upper gate wire.

The first switching gate electrode 124a, the fifth switching gate electrode 124e, and the drive gate electrode 125 are formed to overlap part of the first switching semiconductor layer 131a, the fifth switching semiconductor layer 131e, and the drive semiconductor layer 132. The overlap of the drive semiconductor layer 131a may include the channel region.

An interlayer insulating layer 160 is formed on the gate insulating layer 140. The interlayer insulating layer 160 may be used to cover the first switching gate electrode 124a, the fifth switching gate electrode 124e, the drive gate electrode 125, and the second storage plate 711. The gate insulating layer 140 and the interlayer insulating layer 160 have contact holes 162 and 163 for exposing the source region of the first switching semiconductor layer 131a and the drain region of the fifth switching semiconductor layer 131e. The interlayer insulating layer 160 includes a pixel opening 161 for exposing most of a region of the pixel electrode 710. The interlayer insulating layer 160 includes a storage plate opening 164 for exposing the second storage plate 711. Exposing the second storage plate 711 allows for doping the first storage plate 138. The doping of the first storage plate 138 forms a capacitance.

The interlayer insulating layer 160 is made of ceramic materials, e.g., SiNx or SiO$_2$. The SiNx or SiO$_2$ is made in a similar manner to the gate insulating layer 140.

A data line 171 is formed on the interlayer insulating layer 160. The data line 171 includes the first switching source electrode 173a and a data wire including the fifth switching drain electrode 174e and the common voltage line 172.

The first switching source electrode 173a and the fifth switching drain electrode 174e are connected to the source region of the first switching semiconductor layer 131a and the drain region of the fifth switching semiconductor layer 131e through the contact holes 162 and 163. The contact holes 162 and 163 are formed in the interlayer insulating layer 160 and the gate insulating layer 140.

As shown in part A of FIG. 1, the fifth switching drain electrode 174e is extended to the side wall of the pixel opening 161. The fifth switching drain electrode 174e is connected to the pixel electrode 710 through the gate auxiliary line 129. The gate auxiliary line 129 is exposed through the pixel opening 161.

A barrier rib 180 is formed in the interlayer insulating layer 160. The barrier rib may be used for covering the data wires 171, 173a, 174e, and 172. The barrier rib 180 has a barrier rib opening 181 for exposing the pixel electrode 710. The barrier rib 180 may be made of resin, e.g., polyacrylate resin and polyimides or inorganic matters of silica.

An organic emission layer 720 is formed on the pixel electrode 710. The common electrode 730 is formed in the organic emission layer 720. Thus, the organic light emitting element 700 is formed. The organic light emitting element 700 includes the pixel electrode 710, the organic emission layer 720, and the common electrode 730.

The organic emission layer 720 may be made of low molecular weight organic material or high molecular weight organic material, e.g., poly 3,4-ethylenedioxythiophene (PEDOT). The organic emission layer 720 may be formed with multiple layers. The multiple layers may include at least one of an emission layer, a hole injection layer (HIL), a hole transport layer (HTL), an electron transport layer (ETL), and an electron injection layer (EIL). When all the multiple layers are included, the hole injection layer (HIL) is disposed on the pixel electrode 710. The pixel electrode 710 is an anode. The hole transport layer (HTL), the emission layer, the electron transport layer (ETL), and the electron injection layer (EIL) are sequentially stored on the hole injection layer (HIL). The common electrode 730 is made of a reflective conductive material. The common electrode 730 becomes a bottom emission type of organic light emitting diode (OLED) display. The reflective conductive material may include, e.g., lithium (Li), calcium (Ca), lithium fluoride/calcium (LiF/Ca), lithium fluoride/aluminum (LiF/Al), aluminum (Al), silver (Ag), magnesium (Mg), or gold (Au).

A sealing member 210 faces the common electrode 730 on the substrate 110. The sealing member 210 is made of a transparent material, e.g., glass or plastic.

The contact area of the pixel electrode 710 and the fifth switching drain electrode 174e can be increased by extending the fifth switching drain electrode 174e to the side wall of the pixel opening 161 of the interlayer insulating layer 160. The contact area of the pixel electrode 710 and the fifth switching drain electrode 174e may not be increased by forming a pixel contact hole for connecting the fifth switching drain electrode 174e and the pixel electrode 710 in the interlayer insulating layer 161. The fifth switching drain electrode 174e may contact the pixel electrode 710 through the gate auxiliary line 129. Therefore, contact resistance is reduced.

The pixel contact hole is not formed in the interlayer insulating layer 160. Therefore, a wider pixel opening 161 can be formed in the interlayer insulating layer 160. Thus, the aperture ratio is improved.

To compensate deterioration of the organic light emitting element, the present embodiments are applied to the configuration in which the fifth switching drain electrode 174e contacts the pixel electrode 710. The present embodiments are also applicable to the configuration in which the drive drain electrode of the drive thin film transistor contacts the pixel electrode.

FIGS. 3, 5, 7, and 9 illustrates sequential layout views of a manufacturing method of an organic light emitting diode (OLED) display according to an exemplary embodiment. FIG. 4 illustrates a cross-sectional view of an organic light emitting diode (OLED) display of FIG. 3 with respect to lines IV-IV', IV'-IV", and IV"-IV'". FIG. 6 illustrates a cross-sectional view of an organic light emitting diode (OLED) display of FIG. 5 with respect to lines VI-VI', VI'-VI", and VI"-VI'". FIG. 8 illustrates a cross-sectional view of an organic light emitting diode (OLED) display of FIG. 7 with respect to lines VIII-VIII', VIII'-VIII", and VIII"-VIII'". FIG. 10 illustrates a cross-sectional view of an organic light emitting diode (OLED) display of FIG. 9 with respect to lines X-X', X'-X", and X"-X'".

Figure 3:
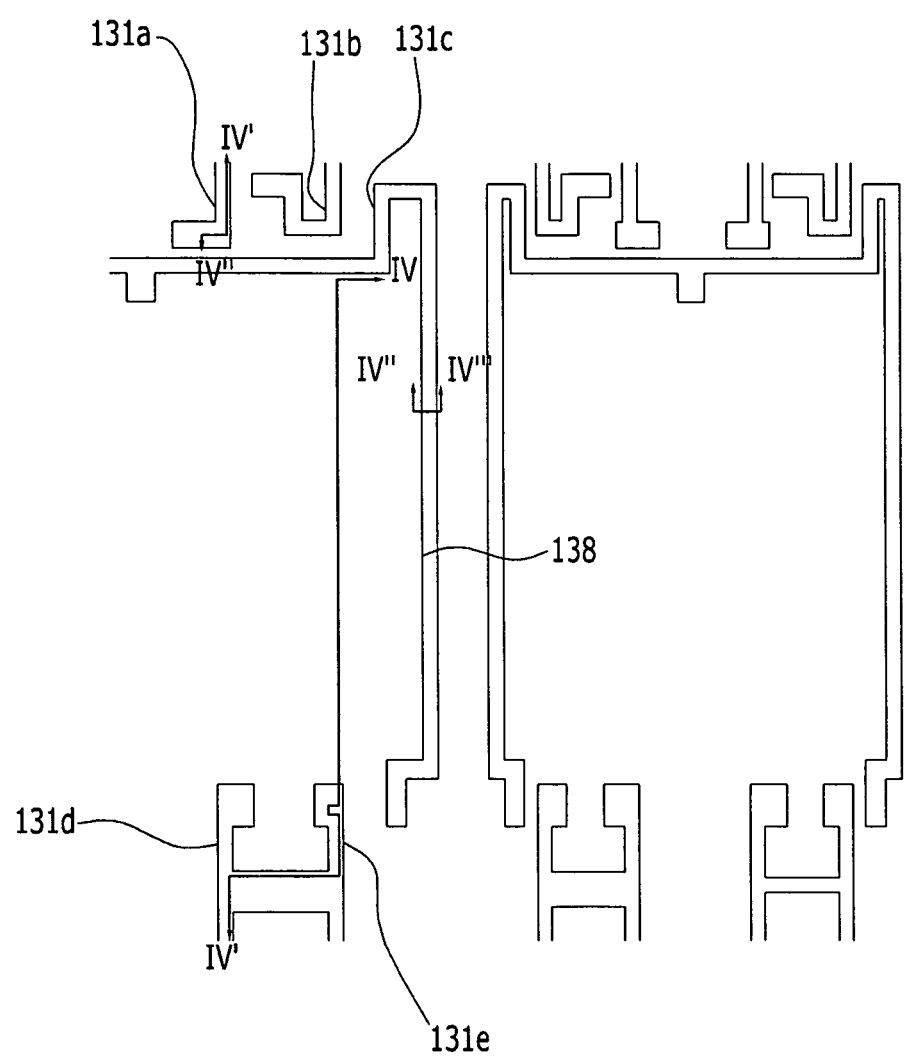
FIGS. 3, 5, 7, and 9 illustrate sequential layout views of a manufacturing method of an organic light emitting diode (OLED) display according to an exemplary embodiment.
Figure 4:
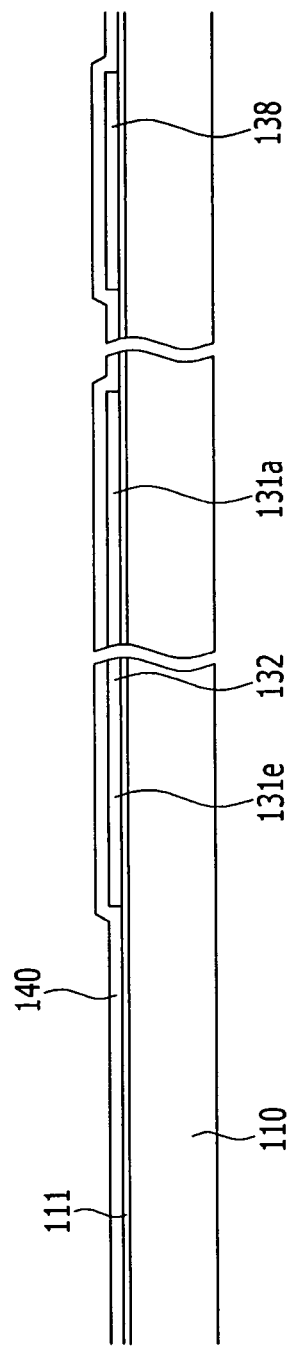
FIG. 4 illustrates a cross-sectional view of an organic light emitting diode (OLED) display of FIG. 3 with respect to lines IV-IV', IV'-IV'', and IV''-IV'''.

In FIGS. 3-4, a buffer layer 111 is formed on the substrate 110. The substrate 110 is made of a transparent insulation substrate, e.g., glass, quartz, or plastic. The buffer layer 111 can be formed with a single layer of SiNx or accumulated layers of SiNx or $SiO_2$. The buffer layer 111 is deposited on the substrate 10 through the plasma-enhanced chemical vapor deposition (PECVD) method. A semiconductor layer is formed in the buffer layer 111. The semiconductor layer is made of a polysilicon layer. The polysilicon layer is formed by using an amorphous silicon layer and crystallizing the same. Many known methods are applicable to the crystallization method. The amorphous silicon layer may be crystallized by using heat, laser beams, Joule heat, an electric field, or a catalyst metal. The semiconductor layer may be patterned by using a first mask through photolithography. Therefore, the first to fifth switching semiconductor layers 131a, 131b, 131c, 131d, and 131e, the drive semiconductor layer 132, and the first storage plate 138 are simultaneously formed. A gate insulating layer 140 is formed on the first to fifth switching semiconductor layers 131a, 131b, 131c, 131d, and 131e, the drive semiconductor layer 132, and the first storage plate 138. The gate insulating layer 140 may be formed with accumulated layers of SiNx and TEOS. The gate insulating layer 140 is deposited on the buffer layer 111 by using the PECVD method.

Figure 5:
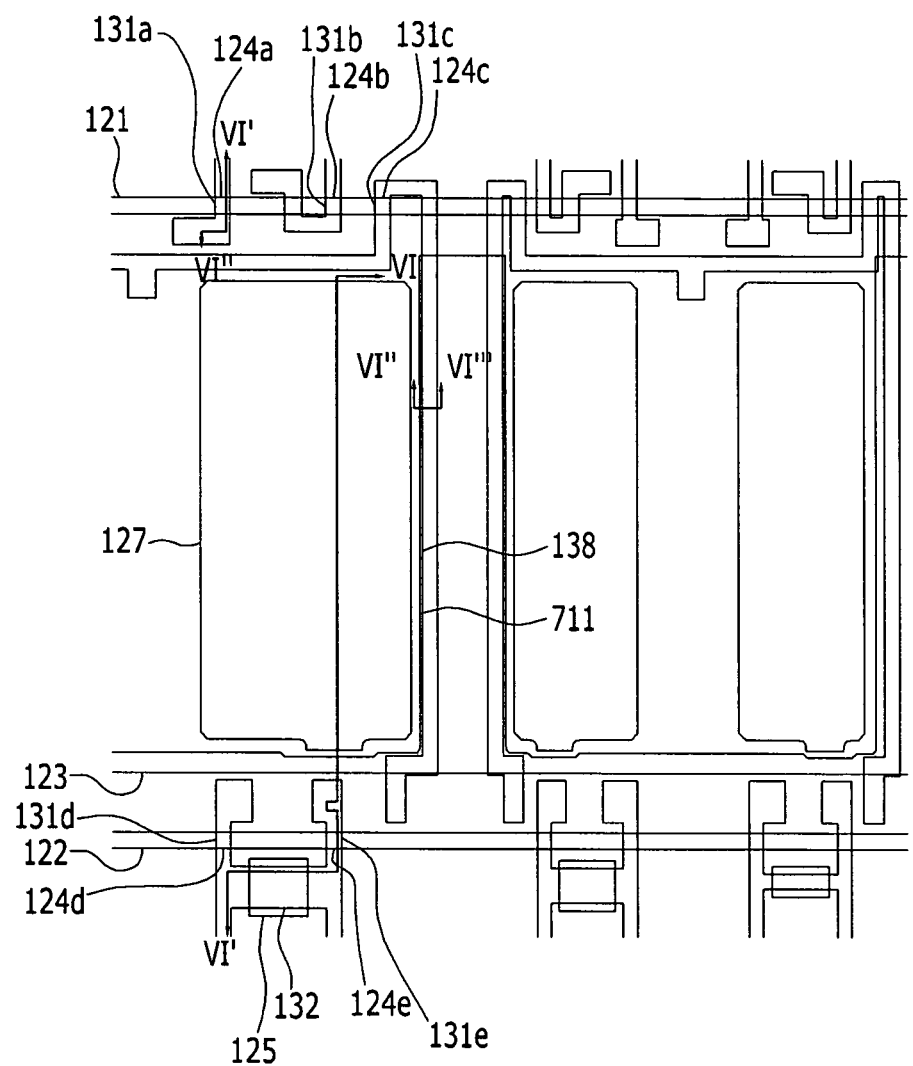
Figure 6:
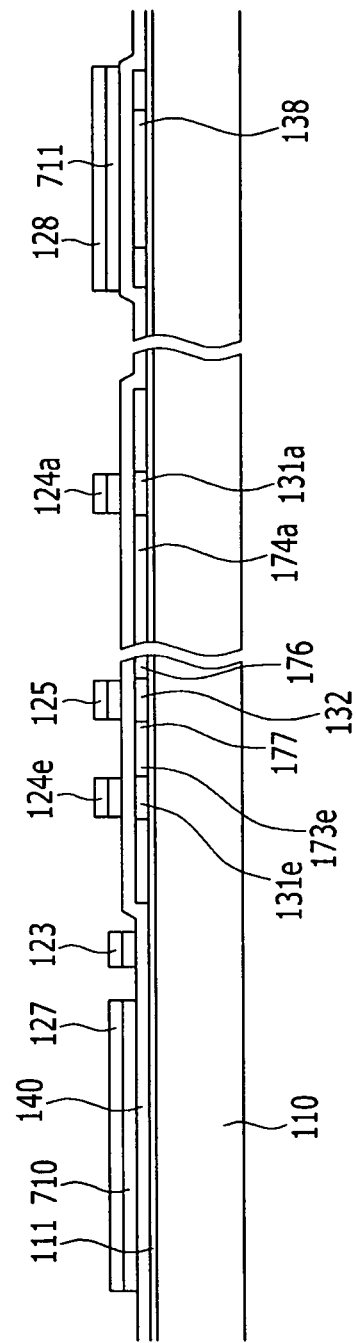
FIG. 6 illustrates a cross-sectional view of an organic light emitting diode (OLED) display of FIG. 5 with respect to lines VI-VI', VI'-VI'', and VI''-VI'''.

As illustrated in FIGS. 5-6, a pixel electrode layer and a gate metal layer are sequentially formed on the gate insulating layer 140. The pixel electrode layer may be made of ITO or IZO. The gate metal layer may be formed with a metal layer including one of copper (Cu), a copper alloy, aluminum (Al), and an aluminum alloy. The gate metal layer may also be formed with a metal layer accumulated as multiple layers, e.g., one of molybdenum (Mo) and a molybdenum alloy. The gate metal layer and the pixel electrode are patterned through photolithography by using a second mask. The gate line 121 is formed. The gate line 121 includes the first to third switching gate electrodes 124a, 124b, and 124c, the gate control line 122 including the fourth and fifth switching gate electrodes 124d and 124e, the drive gate electrode 125, the gate driving voltage line 123, the gate auxiliary member 127, and the storing auxiliary member 128. The gate auxiliary member 127 is formed as the same size as the pixel electrode 710. The gate auxiliary member 127 is on the position corresponding to the pixel electrode 710. The storing auxiliary member 128 is formed as the same size as the second storage plate 711. The storing auxiliary member 128 is on a position corresponding to the second storage plate 711.

An impurity is doped to the first to fifth switching semiconductor layers 131a, 131b, 131c, 131d, and 131e and the drive semiconductor layer 132. The doped impurity distinguishes a channel region, a source region, and a drain region of the first to fifth switching semiconductor layers 131a, 131b, 131c, 131d, and 131e and the drive semiconductor layer 132. The channel region is an intrinsic semiconductor with no doped impurity. The source region and the drain region are impurity-doped impurity semiconductors. When the impurity is doped to the source region and the drain region, the first to fifth switching gate electrodes 124a, 124b, 124c, 124d, and 124e and the drive gate electrode 125 prevent the impurity from being doped to the channel region.

Figure 7:
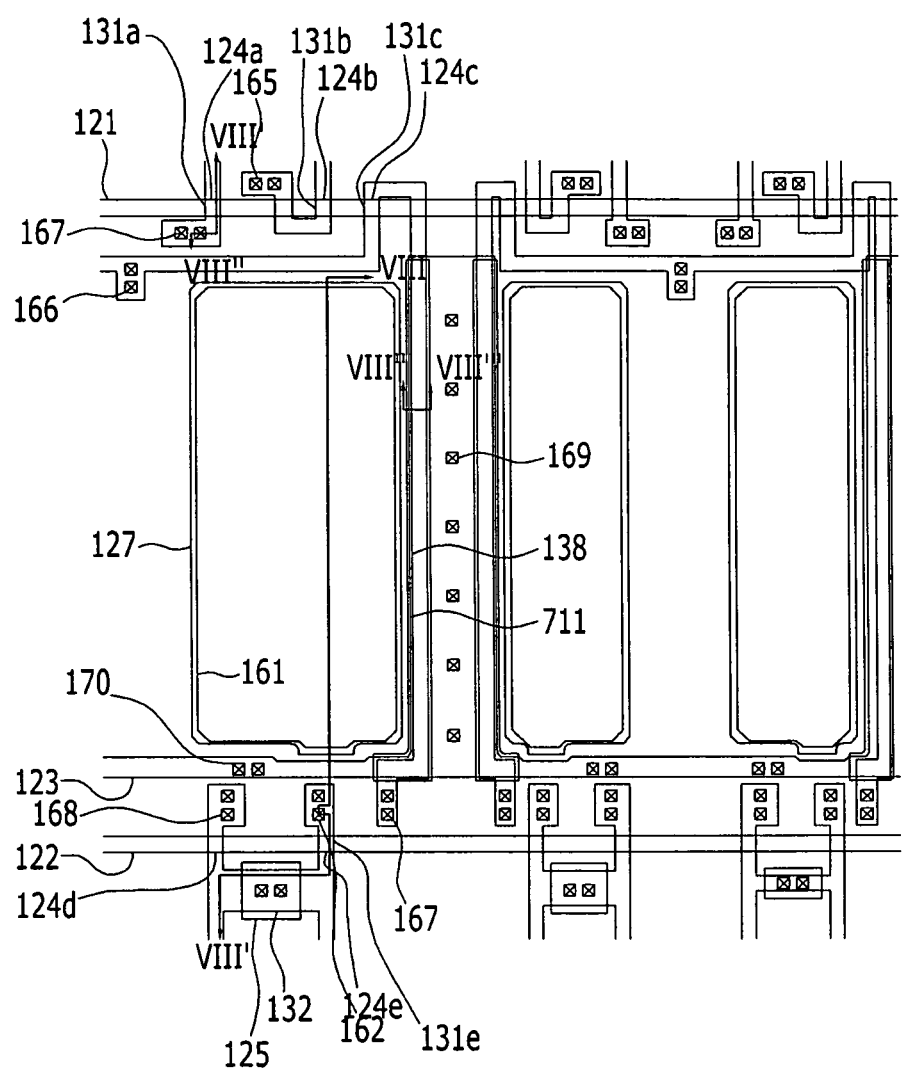
Figure 8:
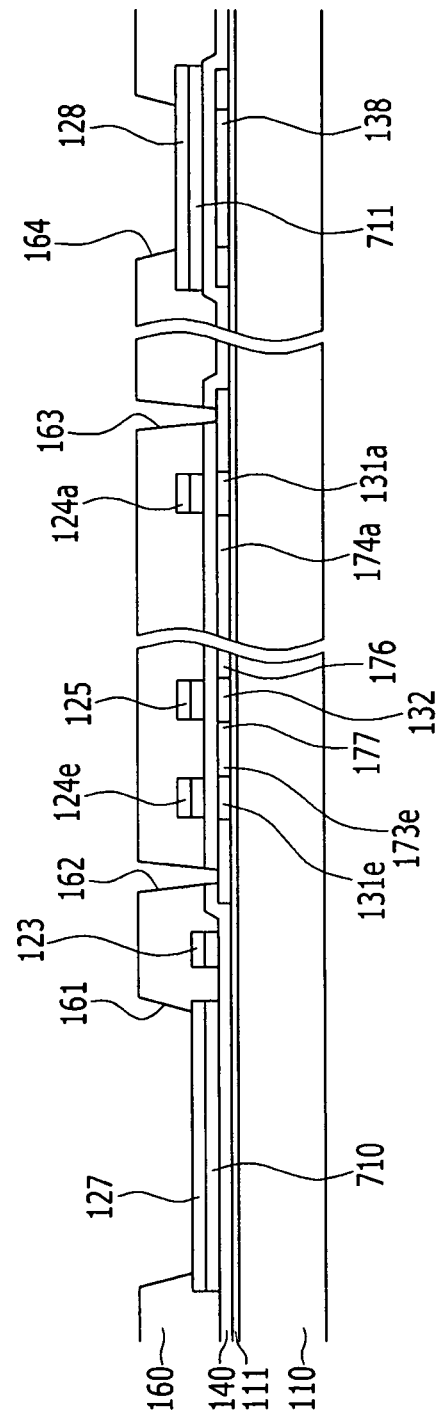
FIG. 8 illustrates a cross-sectional view of an organic light emitting diode (OLED) display of FIG. 7 with respect to lines VIII-VIII', VIII'-VIII'', and VIII''-VIII'''.

As illustrate in FIGS. 7-8, an interlayer insulating layer 160 is formed on the gate line 121. The gate line 121 includes the first to third switching gate electrodes 124a, 124b, and 124c, the gate control line 122, the drive gate electrode 125, the gate driving voltage line 123, and the gate auxiliary member 127. The gate control line 122 includes the fourth and fifth switching gate electrodes 124d and 124e. The interlayer insulating layer 160 is formed to be an organic layer or inorganic layer, and is deposited on the substrate 110. The interlayer insulating layer 160 is patterned by photolithography using a third mask to form a pixel opening 161, a plurality of contact holes 162, 163, 165, 166, 167, 168, 169, and 170, and a storage plate opening 164. The pixel opening 161 of the interlayer insulating layer 160 exposes the gate auxiliary member 127.

A wider pixel opening 161 can be formed in the interlayer insulating layer 160 because no additional pixel contact hole is formed in the interlayer insulating layer 160. The pixel contact hole is used for connecting the pixel electrode 710 and the fifth switching drain electrode 174e. Thus, the aperture ratio is improved.

The contact holes 162 and 163 of the interlayer insulating layer 160 exposes the source region of the first switching semiconductor layer 131a and the drain region of the fifth switching semiconductor layer 131e. Thus, the contact holes 162 and 163 are formed when the interlayer insulating layer 160 and the gate insulating layer 140 are removed.

Figure 9:
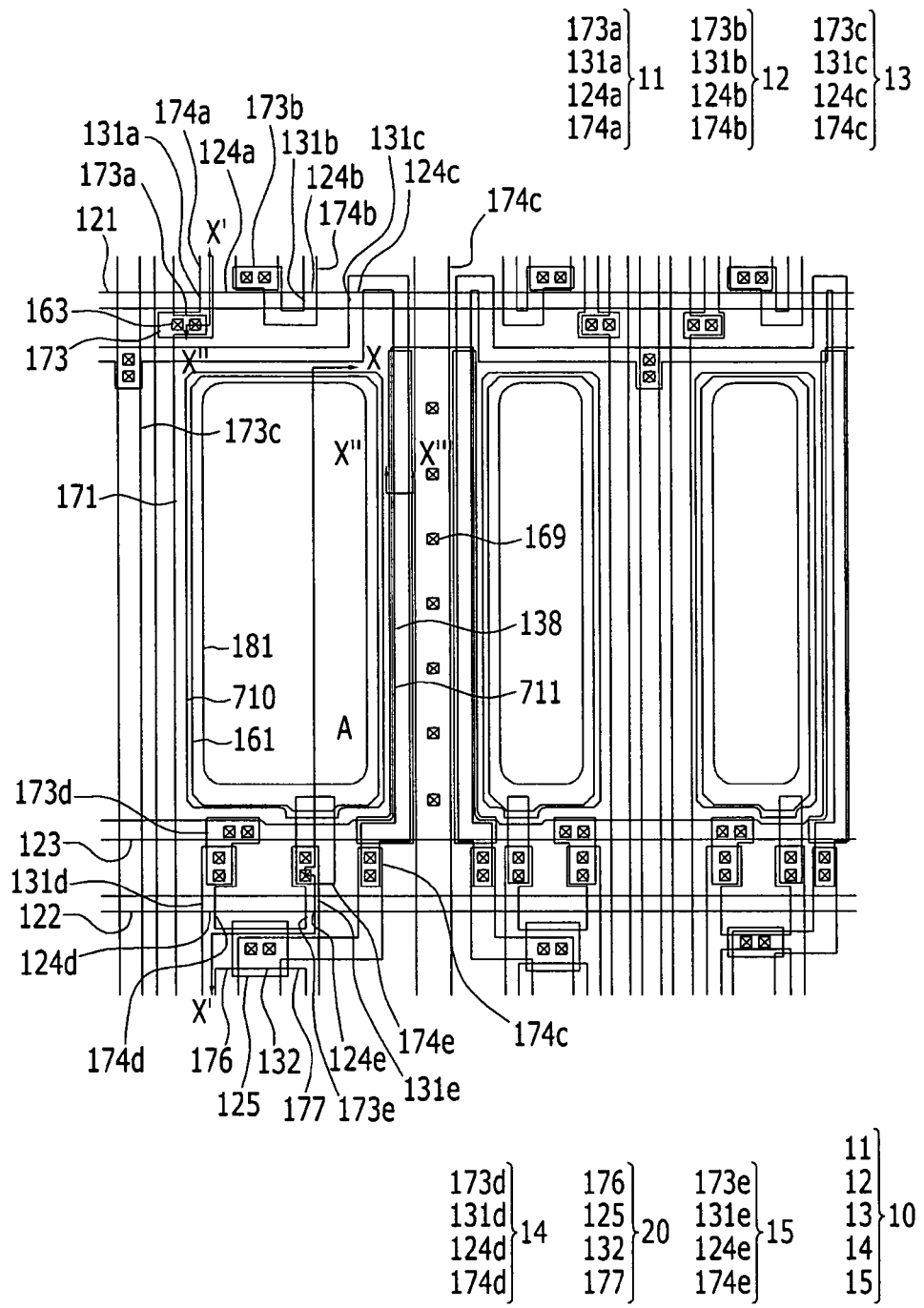
Figure 10:
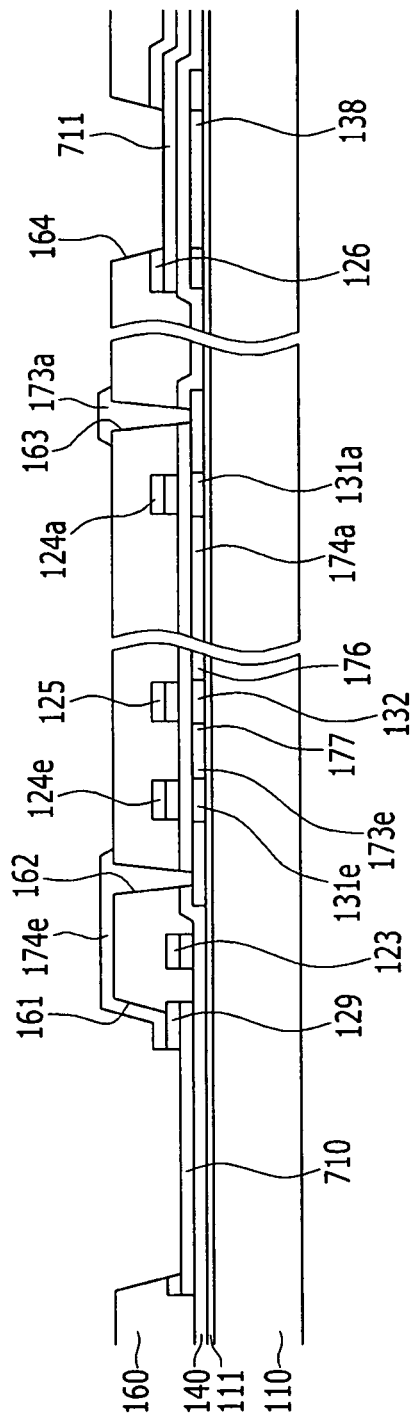
FIG. 10 illustrates a cross-sectional view of an organic light emitting diode (OLED) display of FIG. 9 with respect to lines X-X', X'-X'', and X''-X'''.

As illustrated in FIGS. 9-10, a data metal layer is formed in the interlayer insulating layer 160. The data metal layer may be formed with a metal layer, e.g. one of copper, copper alloy, aluminum, and aluminum alloy. The data metal layer may also be formed of multiple layers accumulated with metal layers, e.g., one of molybdenum and a molybdenum alloy. For example, the data metal layer 19 can be formed with three layers of Mo/Al/Mo or Mo/Cu/Mo.

The data metal layer is patterned by the photolithography process by using a fourth mask. The data line 171 is formed. The data line includes the first switching source electrode 173a, the fifth switching drain electrode 174e, the common voltage line 172, and other wires. The gate auxiliary member 127 exposed through the pixel opening 161 of the interlayer insulating layer 160 is etched to allow the gate auxiliary line 129 to remain. During the process, the pixel electrode 710 is exposed. The pixel electrode 710 is below the gate auxiliary member 127. The fifth switching drain electrode 174e and the gate auxiliary member 127 are formed with the same material. Therefore, the contact in the pixel opening 16, between the fifth switching drain electrode 174e and the gate auxiliary member 127, can be simultaneously eliminated by one etching process. The etching process may use the same etchant. The gate auxiliary line 129 that is not exposed through the pixel opening 161 remains between the fifth switching drain electrode 174e and the pixel electrode 710. The storing auxiliary member 128, revealed through the storage plate opening 164 of the interlayer insulating layer 160, is etched to maintain the storage plate auxiliary line 126. During the process, the second storage plate 711 is exposed.

As illustrated in FIGS. 1-2, a barrier rib 180 is formed in the interlayer insulating layer 160 to cover the data line 171. The data line 171 includes the first switching source electrode 173a, the fifth switching drain electrode 174e, the common voltage line 172, and other wires. A barrier rib opening 181 is formed on the barrier rib 180 by using a fifth mask. The barrier rib opening 181 is used for exposing part of the pixel electrode 710. The barrier rib opening 181 corresponds to the light emitting region. An organic emission layer 720 is formed on the pixel electrode 710. The organic emission layer 720 is exposed through the barrier rib opening 181. A common electrode 730 is formed in the organic emission layer 720 to generate the organic light emitting element 700. The common electrode 730 is also formed over a plurality of pixels on the barrier rib 180. The organic emission layer 720 is formed with multiple layers, including a hole injection layer (HIL), a hole transport layer (HTL), an emission layer, an electron transport layer (ETL), and an electron injection layer (EIL). When the pixel electrode 710 is an anode, the hole injection layer (HIL), the hole transport layer (HTL), the emission layer, the electron transport layer (ETL), and the electron injection layer (EIL) are sequentially accumulated on the pixel electrode 710. Layers other than the emission layer may be omitted, if necessary. In addition, layers other than the emission layer may be formed on the barrier rib 180.

An encapsulation member 210 is disposed on the common electrode 730. An encapsulation member is used to protect the organic light emitting element 700. The encapsulation member 210 can be sealed to the substrate 110 by a sealant (not shown). The encapsulation member may be formed with various materials, e.g., glass, quartz, ceramic, plastic, and metal. An encapsulation thin film layer may also be formed by depositing an inorganic layer and an organic layer on the common electrode 730. The encapsulation thin film layer may not be formed by using a sealant.

According to an embodiment, by using five masks, the organic light emitting diode (OLED) display may simplify the configuration and the manufacturing method.

By way of summation and review, in the case of top emission, the common electrodes must be formed with a transparent material. Thus, large organic light emitting diode (OLED) displays result in reduced resistance. To solve the resistance problem, bottom emission is applied to the large organic light emitting diode (OLED) display. However, in bottom emission, the aperture ratio is reduced. The aperture ratio is reduced because areas in which gate lines, data lines, driving voltage lines, and various circuit wires do not overlap the pixel electrodes correspond to pixel areas.

According to the present embodiments, no pixel contact hole is formed on the interlayer insulating layer. A drive drain electrode is extended to a side wall of a pixel opening so that the drive drain electrode directly contacts the pixel electrode. Therefore, a contact area of the pixel electrode and the drive drain electrode is increased. Thus, contact resistance is reduced.

Accordingly, since no pixel contact hole is formed in the interlayer insulating layer, a wider pixel opening can be formed in the interlayer insulating layer. Thus, the aperture ratio is improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. An organic light emitting diode display comprising:
    a substrate;
    a semiconductor layer on the substrate;
    a gate insulating layer covering the semiconductor layer;
    a gate electrode formed in the gate insulating layer, the gate electrode overlapping the semiconductor layer;
    a pixel electrode formed in a pixel area, the pixel electrode over the gate insulating layer;
    an interlayer insulating layer covering the gate electrode and the gate insulating layer, the interlayer insulating layer exposing the pixel electrode through a pixel opening;
    a source electrode and a drain electrode formed in the interlayer insulating layer, the source electrode and the drain electrode connected to the semiconductor layer;
    a gate auxiliary member between the drain electrode and the pixel electrode; and
    a barrier rib covering the interlayer insulating layer, the source electrode, and the drain electrode, wherein
    the drain electrode and the gate auxiliary member contact a same side wall of the pixel opening and are connected to the pixel electrode, and
    the drain electrode is electrically connected to pixel electrode through the gate auxiliary member without physically contacting the pixel electrode, the drain electrode on an upper surface of the gate auxiliary member.

2. The organic light emitting diode display as claimed in claim 1, wherein the drain electrode is extended to the side wall of the pixel opening.

3. The organic light emitting diode display as claimed in claim 2, wherein the gate auxiliary member is extended to the side wall of the pixel opening.

4. The organic light emitting diode display as claimed in claim 1, wherein the gate auxiliary member follows an outer part of the pixel electrode.

5. The organic light emitting diode display as claimed in claim 1, wherein the gate auxiliary member is made with the same material as the gate electrode.

6. The organic light emitting diode display as claimed in claim 1, wherein the drain electrode is only connected to the pixel electrode through the gate auxiliary member.

7. The organic light emitting diode display as claimed in claim 1, wherein the gate auxiliary member and the drain electrode are made of a same material.

8. The organic light emitting diode display as claimed in claim 1, further comprising:
    a gate driving voltage line between the pixel electrode and a first portion of the drain electrode, wherein a second portion of the drain electrode is over the gate drive voltage line.

9. The organic light emitting diode display as claimed in claim 8, wherein an upper surface of the gate auxiliary member and an upper surface of the gate driving voltage line is substantially coplanar.

10. The organic light emitting diode display as claimed in claim 8, wherein the gate driving voltage line is electrically separated from the drain electrode.

11. A method for manufacturing an organic light emitting diode display, the method comprising:
    forming a semiconductor layer on a substrate;
    forming a gate insulating layer covering the semiconductor layer;
    forming a pixel electrode and a gate electrode on the gate insulating layer;
    forming an interlayer insulating layer on the gate electrode and gate insulating layer, the interlayer insulating layer having a pixel opening for exposing the pixel electrode;
    forming a source electrode and a drain electrode connected to the semiconductor layer through a plurality of contact holes on the interlayer insulating layer; and forming a gate auxiliary member between the drain electrode and the pixel electrode, wherein the drain electrode and the gate auxiliary member contact a same side wall of the pixel opening and are connected to the pixel electrode, and wherein the drain electrode is electrically connected to pixel electrode through the gate auxiliary member without physically contacting the pixel electrode, the drain electrode on an upper surface of the gate auxiliary member.

12. The method as claimed in claim 11, wherein the drain electrode is extended to the side wall of the pixel opening.

13. The method as claimed in claim 11, wherein the drain electrode is only connected to the pixel electrode through the gate auxiliary member.

14. The method as claimed in claim 11, wherein the gate auxiliary member and the drain electrode are made of a same material.

15. The method as claimed in claim 14, wherein forming the drain electrode and forming the gate auxiliary member at the same side wall includes simultaneously etching the same material.

\* \* \* \* \*